(12) United States Patent
Bhatt et al.

(10) Patent No.: US 6,887,651 B2
(45) Date of Patent: May 3, 2005

(54) ELECTRODEPOSITED PHOTORESIST AND DRY FILM PHOTORESIST PHOTOLITHOGRAPHY PROCESS FOR PRINTED CIRCUIT BOARD PATTERNING

(75) Inventors: Ashwinkumar C. Bhatt, Endicott, NY (US); Brant S. Blomberg, Endicott, NY (US); Ross W. Keesler, Endicott, NY (US); Michael V. Longo, Glen Aubrey, NY (US); Eboney J. N. Smith, Johnson City, NY (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 10/304,143

(22) Filed: Nov. 25, 2002

(65) Prior Publication Data

US 2004/0101783 A1 May 27, 2004

(51) Int. Cl.⁷ .................................................. G03F 7/26
(52) U.S. Cl. ...................... 430/314; 430/318; 430/324; 430/325
(58) Field of Search ................................ 430/311, 313, 430/314, 318, 322, 324, 325

(56) References Cited

U.S. PATENT DOCUMENTS

| | | | |
|---|---|---|---|
| 4,690,833 A | * | 9/1987 | Donson et al. ............... 427/96 |
| 4,751,172 A | * | 6/1988 | Rodriguez et al. ........... 204/478 |
| 4,783,247 A | | 11/1988 | Seibel ...................... 204/181.1 |
| 5,160,579 A | * | 11/1992 | Larson ......................... 216/18 |
| 5,443,672 A | | 8/1995 | Stoll et al. ............. 156/244.17 |
| 5,542,175 A | | 8/1996 | Bhatt et al. ................... 29/846 |
| 5,699,613 A | | 12/1997 | Chong et al. ................. 29/852 |
| 5,758,413 A | | 6/1998 | Chong et al. ................. 29/852 |
| 5,780,143 A | | 7/1998 | Shimamoto et al. ........ 428/209 |
| 5,916,736 A | * | 6/1999 | Doi et al. .................... 430/318 |
| 6,339,197 B1 | | 1/2002 | Fushie et al. ............... 174/262 |
| 2002/0100608 A1 | | 8/2002 | Fushie et al. ............... 174/255 |

* cited by examiner

Primary Examiner—Barbara L. Gilliam
(74) Attorney, Agent, or Firm—William H. Steinberg; John H. Bouchard

(57) ABSTRACT

A hybrid photolithography process for printed circuit board patterning combines two types of photoresist applications to achieve superior protection of printed circuit board (PCB) 'plated through holes' (PTH). In a first step, electro-deposited (ED) photoresist (also known as "ED resist") is applied to a fully copper plated PCB including the 'plated through holes' to protect the outer layers and the 'plated through holes' from copper etchant solution. In a second step, the electro-deposited photoresist is imaged (exposed) and patterned (developed). In a third step, after developing the circuit image, a layer of Dry Film resist is applied to the panel of the PCB on top of the developed electro-deposited (ED) photoresist. This Dry Film resist layer will 'tent' the plated through holes by adding an extra layer of protection to the plated through holes. In a fourth step, the dry film resist is then exposed and developed. At this point, the PCB is etched as normal and all subsequent processing remains unchanged.

20 Claims, 3 Drawing Sheets

ELECTRODEPOSITED PHOTORESIST AND DRY FILM PHOTORESIST PHOTOLITHOGRAPHY PROCESS FOR PRINTED CIRCUIT BOARD PATTERNING

BACKGROUND OF THE INVENTION

The subject matter of the present invention relates to an electrodeposited photoresist and a dry film photoresist hybrid photolithography process for printed circuit board patterning.

The manufacture of Printed Circuit Boards (PCB) includes a subtractive etching process. The subtractive etching process further includes a photolithography process. As a result of the photolithography process, the PCB has been fully copper plated which means that the entire external surface of the PCB has been plated with copper; as a result, the drilled 'through holes' in the PCB have been plated with copper. Normally, a layer of dry film resist is applied to the copper layer which covers the external surface of the PCB. At this point, the next step is to: expose an image that will be etched into the panel of the PCB, develop the photoresist, and etch the copper that is not wanted. This is the 'subtractive' portion of the process wherein the process includes subtracting any unwanted copper from the final product. Then, in connection with the remaining copper that is wanted on the panel of the PCB, the photoresist is stripped from the remaining copper that is wanted on the panel. In order for the PCB to be reliable in terms of its functionality, the 'plated through holes' in the PCB need to be robust; that is, in each of the 'plated through holes', there needs to be an electrical connection between a circuitized image on one surface of the panel and any other interplaying connections on the PCB. In order for the 'plated through holes' to be reliable in terms of their functionality, after the circuitization process, all of the copper in each of the 'plated through holes' should remain in place. That is, if any etchant (which was used to etch the copper on the external surface of the PCB) should get into the 'plated through hole', that etchant would remove the copper from the 'plated through hole' (as it would in connection with the copper on the external surface of the PCB). If the etchant did, in fact, remove some copper from the 'plated through hole', a defect could be seen on the external surface of the PCB panel. One such defect is known as a "rim void". An annular ring, known as a 'land', is disposed around each of the 'plated through holes' on the external surface of the PCB. If any damage is done to the photoresist that is covering the aforementioned 'land', or if there is no photoresist on the aforementioned 'land' for some reason, damage would exist on the copper associated with that 'land/annular ring'. That is, since at least some of the photoresist was not present on the aforementioned land/annular ring, it is assumed that the etchant was able to enter the 'plated through hole' and, to some degree, etch-out the barrel of the 'plated through hole'. The aforementioned damage to the 'land/annular ring', where the outerlayer annular copper ring (or land) surrounding the 'plated through hole' has been compromised by etchant solution, is known as a 'rim void'. More than likely, that 'rim void' damage to the 'plated through hole' is a scrappable defect. If the 'rim void' progresses into the 'plated through hole', copper etchant solution has definitely infiltrated the 'plated through hole' and may have etched a significant portion of the hole plating away causing an instantaneous or latent electrical open-circuit. Therefore, in the prior art, the higher the number of 'plated through holes' on a PCB, the higher the number of 'rim voids' which may exist (where the photoresist covering the 'lands' around the 'plated through holes' is damaged) on the 'lands/annular rings' around the 'plated through holes' of the PCB.

The following patent application set forth below in item number (1) and the following eight (8) patents set forth below in items (2) through (8) are all incorporated herein by reference into the specification of this application:

(1) U.S. Patent Application Publication No. US 2002/0100608, published Aug. 1, 2002, to Fushie et al, entitled "Multilayer Printed Wiring Board and a Process of Producing Same";

(2) U.S. Pat. No. 6,339,197 B1, issued Jan. 15, 2002, to Fushie et al, and entitled "Multilayer Printed Circuit Board and the Manufacturing Method";

(3) U.S. Pat. No. 5,780,143, issued Jul. 14, 1998, to Shimamoto et al, and entitled "Circuit Board";

(4) U.S. Pat. No. 5,758,413, issued Jun. 2, 1998, to Chong et al, entitled "Method of Manufacturing a Multiple Layer Circuit Board Die Carrier with Fine Dimension Stacked Vias";

(5) U.S. Pat. No. 5,699,613, issued Dec. 23, 1997, to Chong et al, entitled "Fine Dimension Stacked Vias for a Multiple Layer Circuit Board Structure";

(6) U.S. Pat. No. 5,542,175, issued Aug. 6, 1996, to Bhatt et al, entitled Method of Laminating and Circuiting Substrates Having Openings Therein;

(7) U.S. Pat. No. 5,443,672, issued Aug. 22, 1995, to Stoll et al, entitled "Process for Coating Circuit Boards"; and (8) U.S. Pat. No. 4,783,247, issued Nov. 8, 1988, to Seibel, entitled "Method and Manufacture for Electrically Insulating Base Material Used in Plated-through Printed Circuit Panels".

SUMMARY OF THE INVENTION

The hybrid photolithography process for printed circuit board patterning in accordance with the present invention combines two types of photoresist applications to achieve superior protection of printed circuit board (PCB) 'plated through holes' (PTH). In a first step of the process, electrodeposited (ED) photoresist (also known as "ED resist") is applied to a fully copper plated PCB including the 'plated through holes' to protect the outer layers and the 'plated through holes' from copper etchant solution. In a second step, the electro-deposited photoresist is imaged (exposed) and patterned (developed). In a third step, after developing the circuit image, a layer of dry film resist is applied to the panel of the PCB on top of the developed electro-deposited photoresist. This dry film resist layer will 'tent' the plated through holes by adding an extra layer of protection to the plated through holes. In a fourth step, the dry film resist is then exposed and developed. At this point, the PCB is etched as normal and all subsequent processing remains unchanged.

As a result, product yield is improved. In addition, circuit images including lands around the 'plated through holes' will be doubly protected by the two different ED-Resist and Dry Film photoresist systems.

In connection with the 'Dry Film resist' layer, the Dry Film resist process is known as a 'tent and etch' process. The Dry Film is applied over the panel of the PCT and it acts as a 'tent' over any drilled and plated through holes in the PCB. There must be enough 'real estate' around the 'plated through hole' to ensure that the resist will adhere to the panel while undergoing the circuitization process. If that 'tent' is broken, the 'tent' has failed and etchant solution can go inside the 'plated through hole' where the copper is unprotected. This is the main disadvantage associated with the Dry Film resist.

In connection with the 'ED resist' layer, when the copper panel of the PCB is coated with the 'ED resist', that 'ED resist' will coat both the external panel of the PCB and the internal portion of the 'plated through hole'. That is, the 'ED resist' will coat the 'plated through holes' in addition to all of the other copper surfaces of the PCB panel. However, there are problems associated with using only one photoresist layer, such as the 'ED resist' layer, to coat the internal surfaces (e.g. 'plated through holes') and the external surfaces of the PCB especially since the 'ED resist' layer is very thin. That is, there is plenty of opportunity for damage to occur to the aforementioned very thin 'ED resist' layer, and recall that the etchant solution will have access to the damaged portions of the 'ED resist' layer. The 'ED resist' layer does protect the internal connections of a 'plated through hole', even if there is some external damage to the 'land/annular ring' on the external surface of the PCB panel, since the 'ED resist' layer coats the entire internal barrel wall of the 'plated through hole'. However, 'other circuitization features' exist on the external surface of the PCB panel, such as capacitor pads or a power plane or signal wires from one pad to another pad. Therefore, if one were to coat the PCB with only one 'electro-deposited (ED) photoresist (ED resist)' layer, the internal barrels of all the 'plated through holes' would be protected by the ED resist layer, however, if the 'ED-Resist' layer that coats the 'other circuitization features' on the external surface of the PCB panel is damaged, one or more of the 'other circuitization features' on the external surface of the PCB panel would be relatively unprotected and therefore such other circuitization features could include a high number of scrap defects.

However, if, in accordance with one aspect of the present invention, one were to coat the PCB with both of the above mentioned two types of photoresist layers [i.e., the 'electro-deposited (ED) photoresist' (or 'ED Resist') layer, and the 'Dry Film resist' layer], the benefits of the 'Dry Film resist' layer are obtained for protecting the 'other circuitization features' on the external layers of the PCB, and the benefits of the 'electro-deposited (ED) photoresist' layer are obtained for protecting the internal barrel walls of the 'plated through holes'. As a result, superior protection is obtained for both: (1) the external portions of the PCB (i.e., the 'other circuitization features' on the external surface of the PCB) when the Dry Film resist is used to coat only the external 'other circuitization features' on the PCB (since the Dry Film resist does not actually enter the internal 'plated through holes', and (2) the internal portions of the PCB (i.e., the 'plated through holes' on the internal surface of the PCB) when the 'ED Resist' is used to coat the internal 'plated through holes'.

Further scope of applicability of the present invention will become apparent from the detailed description presented hereinafter. It should be understood, however, that the detailed description and the specific examples, while representing a preferred embodiment of the present invention, are given by way of illustration only, since various changes and modifications within the spirit and scope of the invention will become obvious to one skilled in the art from a reading of the following detailed description.

BRIEF DESCRIPTION OF THE DRAWINGS

A full understanding of the present invention will be obtained from the detailed description of the preferred embodiment presented hereinbelow, and the accompanying drawings, which are given by way of illustration only and are not intended to be limitative of the present invention, and wherein.

DETAILED DESCRIPTION OF THE INVENTION

Figure 1:
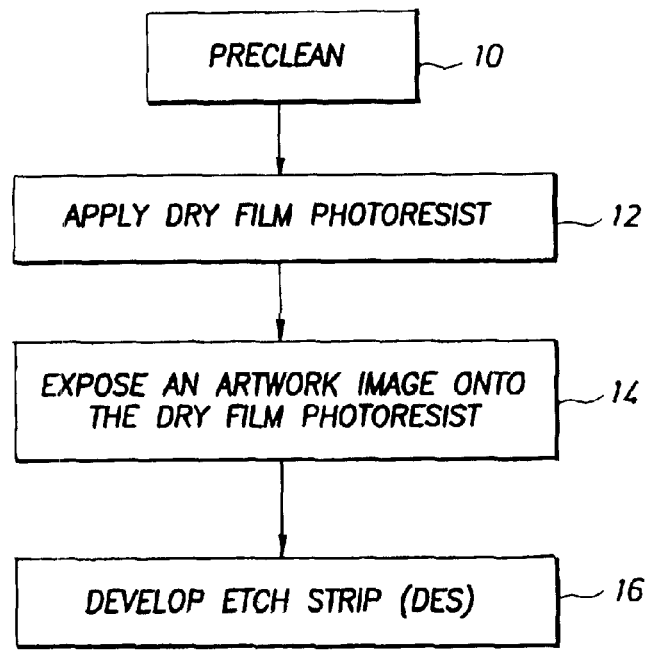
FIG. 1 illustrates a block diagram representing a prior art photolithography process for printed circuit board patterning.

Referring to FIG. 1, a description of the prior art photolithography process for printed circuit board patterning, used during the manufacture of printed circuit boards, is illustrated. The prior art photolithography process for printed circuit board patterning includes the following steps: Preclean, block 10, Apply Dry Film photoresist, block 12, Expose an artwork image onto the Dry Film photoresist, block 14, and Develop Etch Strip (DES), block 16. Each of the block 10 through 16 in FIG. 1 will be discussed in detail as follows:

1. Preclean step, block 10: A printed circuit board must first be pretreated or precleaned. That is, a mechanical treatment is performed to the external surfaces (i.e., a roughening). During a 'nodule remove' or 'chempolish' step, a mechanical abrasion is applied to the surface of the PCB to roughen the copper surface and increase its surface area. This 'roughening' step is necessary to increase the copper surface area of the PCB and to remove any dirt or oil or contaminants that will resist the adhesion of the dry film photoresist layer to the panel of the PCB. A chemical preclean treatment is also available, since mechanical abrasion is not the only option.

2. Apply Dry Film photoresist, block 12: When the aforementioned preclean step is completed, in a laminator, a Dry Film photoresist layer is applied to both external surfaces of the PCB including the roughened copper surface of the PCB.

3. Expose an artwork image onto the photoresist, block 14: When the PCB panel is placed into an expose tool, sandwiched in between two sets of artwork, the next step is to expose an artwork image onto the Dry Film photoresist.

4. Develop Etch Strip (DES), block 16: During this step, the photoresist image is developed. That is, any photoresist that is not necessary to circuitize the wanted image into the PCB panel product is removed. When all the unnecessary photoresist is developed away, the next step is to etch the unwanted copper away from the product. When all the unwanted copper is removed from the final PCB product, the remaining Dry Film photoresist is stripped off. This represents the end of the prior art circuitization process.

Figure 2:
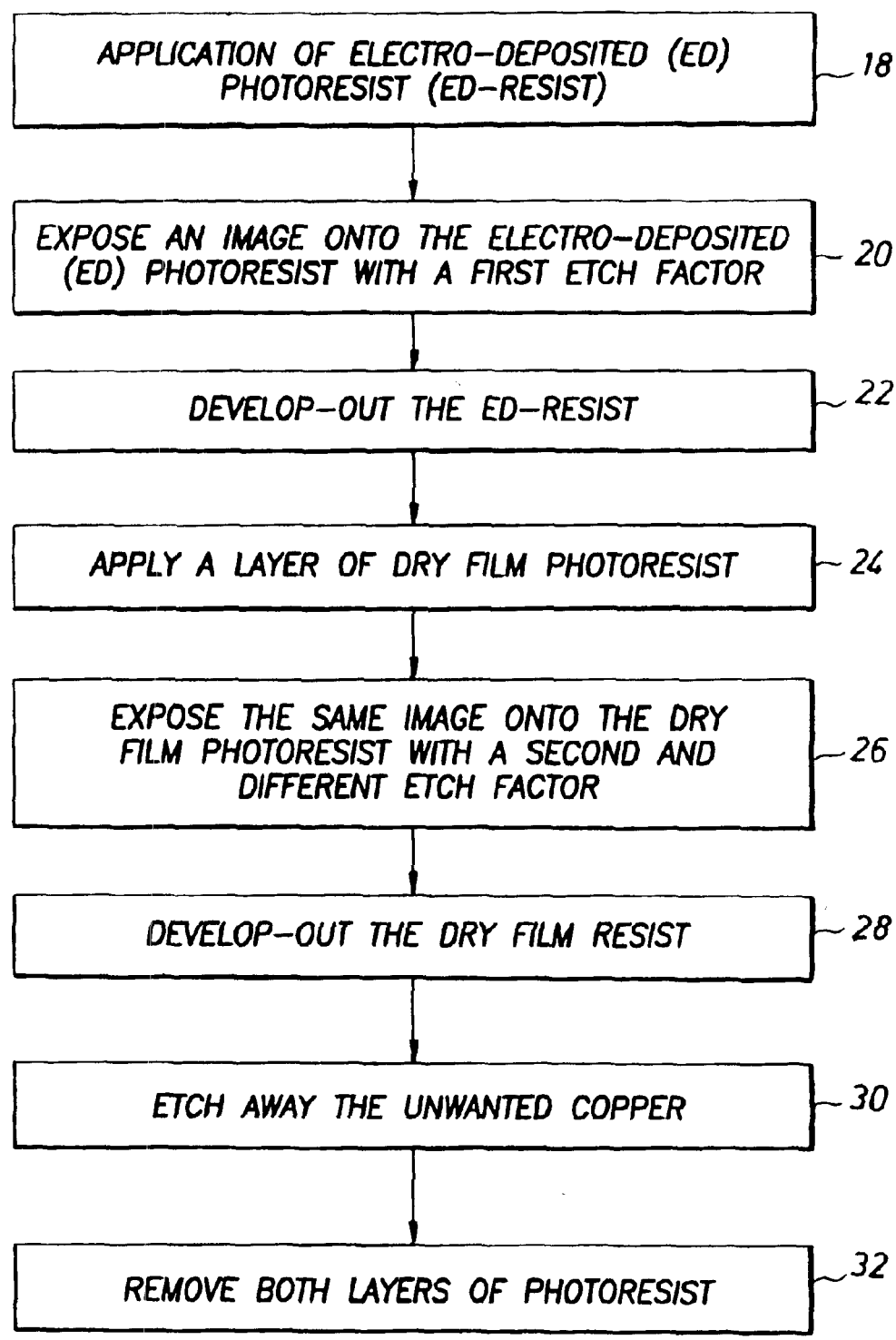
FIG. 2 illustrates a block diagram representing the hybrid photolithography process for printed circuit board patterning in accordance with the present invention.

Referring to FIG. 2, a description of the photolithography process for printed circuit board patterning in accordance with the present invention, used during the manufacture of printed circuit boards, is illustrated. The photolithography process for printed circuit board patterning in accordance with the present invention includes the following steps: Application of Electro-Deposited (ED) photoresist (ED-Resist), block 18; Expose an image onto the Electro-Deposited (ED) photoresist with a First Etch Factor, block 20; Develop-out the ED Resist, block 22; Apply a layer of Dry Film photoresist, block 24; Expose the same image onto the Dry Film photoresist with a second and different etch factor, block 26; Develop-out the Dry Film photoresist, block 28; Etch away the unwanted copper, block 30; and Remove both layers of photoresist, block 32. Each of the block 18 through 32 in FIG. 2 will be discussed in detail as follows:

1. Application of Electro-Deposited (ED) photoresist (ED Resist), block 18: A Preclean step, similar to the preclean step as described above in the prior art process, is first implemented for the purpose of removing any oil or dirt or contaminants that may exist on the surface of the PCB. However, it is not as critical to roughen-up the surface of the PCB during this 'ED Resist apply process' (as it was in connection with the above referenced Preclean step of the prior art prior to application of the Dry Film resist) because a roughened surface is not really needed prior to the application of the Electrodeposited photoresist ('ED Resist') layer. Since the 'ED Resist' layer is electrically driven, the 'ED Resist' layer adheres well to the copper surface of the PCB. During the 'ED Resist' apply process, a coating step is practiced, where the PCB panels are immersed in a series of baths, precleaned, rinsed, and then the PCB panels are immersed in a 'resist bath' where a formal ('ED resist') coating is deposited on and applied to all of the copper that exists on the PCB including the external surfaces of the PCB (i.e., the 'other circuitization features' on the external surfaces of the PCB) and the internal surfaces (i.e., the 'plated through holes'). One example of the Electrodeposited photoresist ('ED resist') coating which can be used is: PEPR 2400 commercially offered by Shipley Company, Inc. of Marlborough, Mass. (although there are some negative ED resists on the market).

2. Expose an 'artwork image' onto the Electro-Deposited (ED) photoresist with a first etch factor, block 20: During the next step, expose an 'artwork image' on the 'ED Resist'; this step will precede the next additional step of developing-out the 'ED Resist' image. During the 'Expose an image onto the ED photoresist' step, expose an 'artwork image' that is desired onto the final product. However, whenever two different expose steps are being practiced for the same 'artwork image', it is possible that one may mis-register one exposed image relative to another exposed image. That is, if the two images are not exactly aligned when the two images are exposed at two different times, the result could be an offset of the images. That is, it is possible that one could deform the wanted final artwork image. However, in order to solve this problem and ensure that there will be no offsetting of images, the artworks must have a 'zero etch factor'. In connection with the 'zero etch factor', one would essentially be blowing-up the image that is wanted in the final product by a particular factor in order to account for etch angles that are obtained when a subtractive etching process is practiced. Therefore, the artwork image will always have an 'etch factor' associated therewith in order to account for the ways in which an etchant solution will work and to better define the final artwork images. In our case, 'one artwork' that is used will have the 'normal etch factor' assigned to it, but the 'other artwork' that is used will have a 'zero etch factor'. As a result, the image on the 'one artwork' is slightly smaller than the image on the the 'other artwork'. That way, a little bit of skew is taken into account between the two different expose passes without there being an overall mis-registration between the two exposed images. In addition, the two different types of artwork having the two different etch factors will help prevent any kind of distortion in the final circuitized image and will prevent any overlapping of the one exposed image onto the other exposed image causing irregularities in the patterns.

3. Develop-out the ED Resist, block 22: This is similar to any other develop step except that a slightly different chemistry is used for the 'ED resist' layer that was previously deposited on the PCB. At this point, the 'ED resist' layer has been applied to the internal surfaces ('plated through holes') and the external surfaces ('other circuitization features') of the PCB panel, a desired artwork image pattern has been exposed onto the 'ED resist' layer, and the exposed 'ED resist' layer has been developed. However, we do not etch away any copper at this point.

4. Apply a layer of Dry Film Photoresist, block 24: At this point, it is necessary to apply a layer of Dry Film photo resist over both the developed 'ED resist' that is remaining on the PCB panel and any visible copper on the panel. Everything on the PCB is coated with the Dry Film photoresist, except that the Dry Film photoresist does not actually enter the 'plated through holes'. The Dry Film photoresist which is used in connection with this preferred embodiment is: MacDermid MI 115. Other Dry Film photoresists include: Dupont Photoresist 3120 and Dupont T168 photoresist.

5. Expose the same 'artwork image' onto the Dry Film photoresist with a second and different etch factor, block 26: During this additional expose step, the same 'artwork image', which was previously exposed onto the 'ED resist' with a first etch factor in step 2 above, is now exposed onto the Dry Film photoresist, however, during this expose step 5, the 'artwork image' that is exposed onto the Dry film photoresist has a second and different etch factor assigned to it relative to the first etch factor of step 2. Therefore, there will be no risk of mismatching the two exposed images with respect to one another.

6. Develop the Dry Film resist, block 28.

Figure 3:
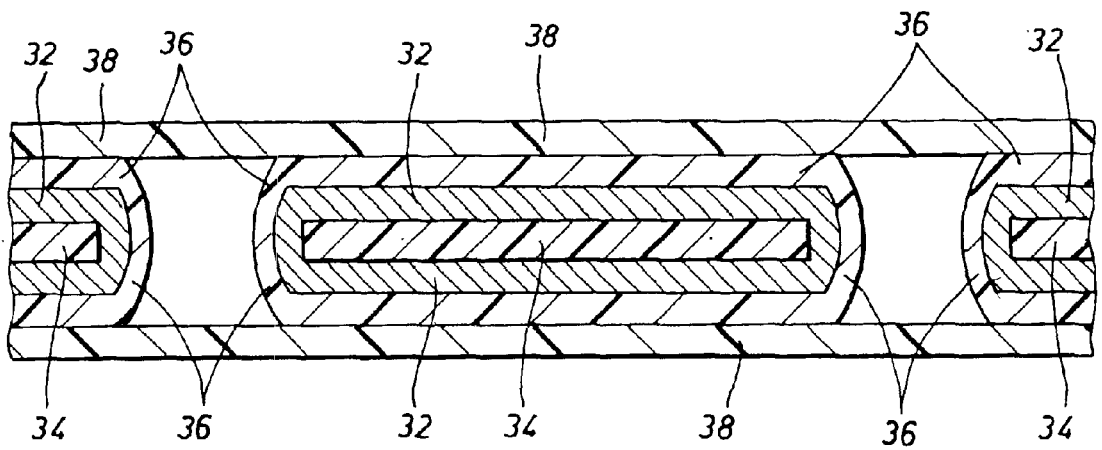
FIG. 3 illustrates a cross section of a printed circuit board including a substrate, a copper layer, an ED-Resist layer, and a Dry Film photoresist layer.

When the Dry Film is developed, we basically have two (2) layers of photoresist on top of each other (ED Resist followed by Dry Film Resist) on the PCB and bare copper everywhere else where we do not want copper to exist in the final product. Refer to FIG. 3 (discussed below) for a pictorial view of the two (2) layers of photoresist on top of each other. In FIG. 3, note that the 'ED-resist' layer is disposed inside the barrel of the 'plated through holes' but the 'Dry Film resist' layer is not disposed inside the barrel of the 'plated through holes'. However, on the external surface of the PCB panel, although the 'ED resist' layer is applied to the external surface, the 'Dry Film resist' layer is also applied to the external surface of the PCB panel.

7. Etch away the unwanted copper, block 30. This step is well known in the prior art.

8. Remove both layers of photoresist, block 32. This step is well known in the prior art.

At this point, the manufacture of the PCB product is complete.

Referring to FIG. 3, a cross sectional view of a Printed Circuit Board (PCB) is illustrated. The cross sectional view of the PCB illustrated in FIG. 3 reflects the state of manufacture of the PCB after either the 'Apply a layer of Dry Film photoresist' step of FIG. 2 (block 24 of FIG. 2) or the 'Develop-out the Dry Film resist' step of FIG. 2 (block 28 of FIG. 2) has been implemented.

In FIG. 3, a copper layer 32 is deposited over a substrate 34. An Electrodeposited (ED) photoresist ('ED Resist') layer 36 is deposited over the copper layer 32, and a 'Dry Film photoresist' layer 38 is deposited over the 'ED Resist' layer 36. The outer 'Dry Film resist' layer 38 does not actually enter the 'plated through holes'. The 'Dry Film resist' material 38 is a solid, yet malleable, material, and it is coated onto a thin layer of mylar substrate. Therefore, when the 'Dry Film resist' 38 is applied, it literally coats only the external surface of the PCB; it does not coat the internal barrel of the 'plated through holes'. However, in FIG. 3, note that the 'ED-resist' layer 36 is disposed inside the barrel of the 'plated through holes' but the 'Dry Film resist' layer 38 is not disposed inside the barrel of the 'plated through holes'. Note the external surface of the PCB where the 'other circuitization features' are disposed; that is, on the external surface of the PCB panel, although the 'ED resist' layer 36 is applied to that external surface, the 'Dry Film resist' layer 38 is also applied to the external surface of the PCB panel. As a result, superior protection is obtained for both: (1) the external portions of the PCB (i.e., the 'other circuitization features' on the external surface of the PCB) when the Dry Film resist 38 is used to coat the external 'other circuitization features' on the PCB (since the Dry Film resist 38 does not actually enter the internal 'plated through holes'), and (2) the internal portions of the PCB (i.e., the 'plated through holes' on the internal surface of the PCB) when the 'ED Resist' 36 is used to coat the internal barrels of 'plated through holes'.

Figure 4:
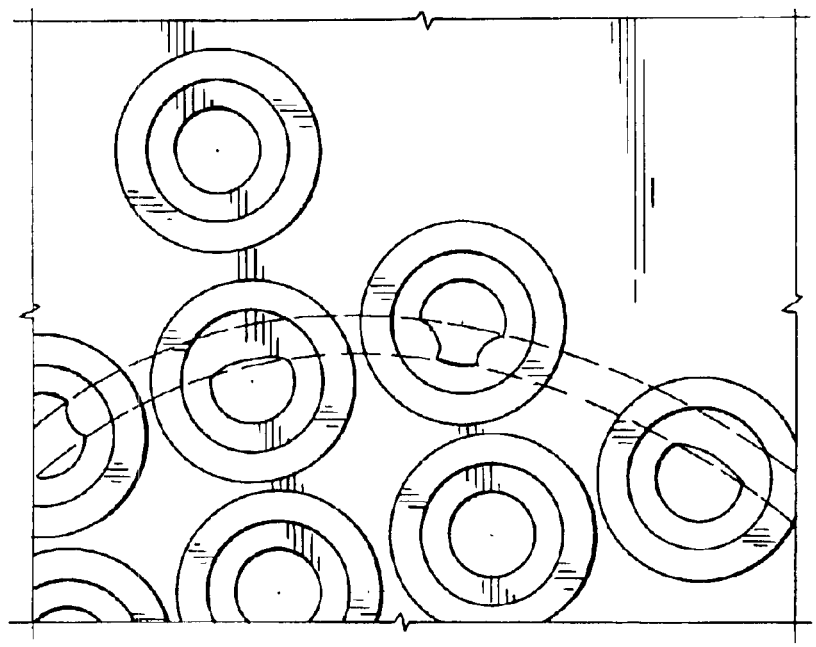
FIG. 4 illustrates a photo showing a view of external circuitry on the printed circuit board (PCB) where damage was created.
Figure 5:
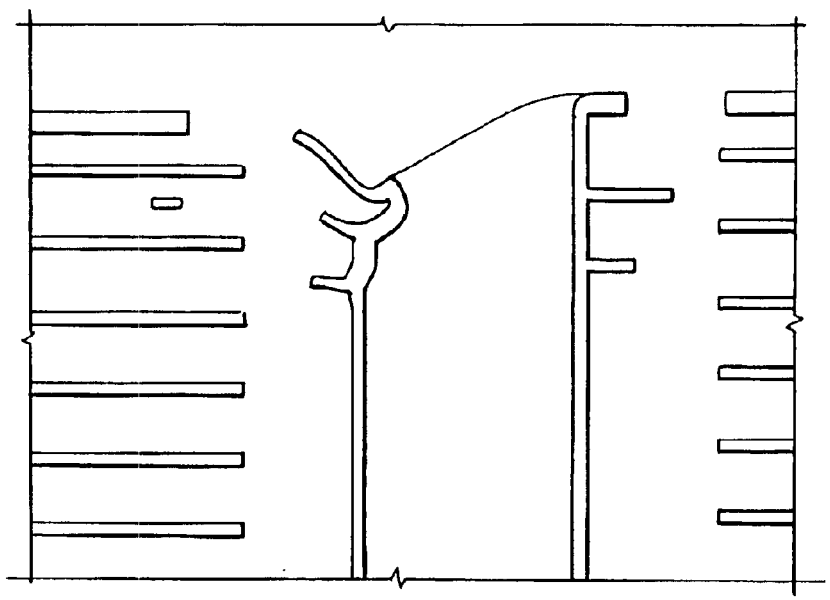
FIG. 5 illustrates a cross-section of a printed circuit board (PCB) demonstrating how the copper in the 'plated through holes' of the PCB was protected from etch-out solution as a result of the hybrid process of the present invention.

Referring now to FIGS. 4 and 5, a set of experimental evidence, indicating that the 'hybrid photolithography process' in accordance with the present invention of FIG. 2 is successful for the purpose of eliminating 'rim void' defects due to non-conformal surfaces on a PCB, is illustrated in FIGS. 4 and 5.

In FIG. 4, the photo shown in FIG. 4 is a view of a set of external circuitry on a PCB where damage was purposely created to the PCB, after which, the PCB was subjected to the hybrid photolithography process of the present invention illustrated in FIG. 2. Normally, the degree of damage to the PCB would not allow 'Dry Film' alone to conform to the damaged copper surface, allowing pathways for etchant solution to etch-out the copper. However, the 'ED resist' does conform to the damaged copper surface of the PCB thereby preventing any etch-outs (in FIG. 4, however, there is no etch out shown). If 'Dry Film resist' alone was used, the lands (i.e., the annular rings around the 'plated through holes') would exhibit massive etch-out.

In FIG. 5, after the PCB underwent the 'hybrid photolithography process' in accordance with the present invention illustrated in FIG. 2, the cross sectional view of the PCB illustrated in FIG. 5 shows how the copper plating in the 'plated through holes' was protected from any massive etch-out.

The following paragraph describes further experiments being conducted in connection with other types of holes in the PCB panel known as 'tooling holes'.

In PCB's, there are at least two type of holes: the 'plated through holes' as previously described and additional 'tooling holes'. The 'tooling holes' are used to allow fasteners to be inserted or attached or a module to be attached to the PCB or to allow the PCB to be attached to another apparatus. The 'plated through holes' must be plated with copper, however, the 'tooling holes' are not plated. Usually, all the holes in a PCB are plated, and, with respect to 'tooling holes', it is necessary to etch out the copper in the 'tooling holes'. This is done by modifying the 'artwork image' in order to develop-out the Dry Film resist in areas where the non-plated 'tooling holes' exist. However, when the above described hybrid process in accordance with one aspect of the present invention as illustrated in FIG. 2 is used (where the 'ED-Resist' layer is first applied to the copper on the PCB including all the plated through holes and all the tooling holes in the PCB and then the 'Dry-Film resist' is applied over the 'ED-Resist' layer), a problem arises in connection with the application of the 'ED-Resist' in the 'tooling holes'. There are basically two types of photo resist systems used in connection with either the 'ED-Resist' and/or the 'Dry Film resist': positive or negative imagable type resists. The positive and negative imagable type resists respond differently to light. While the 'Dry Film photoresist' is a negative type of photoresist, the 'ED-photoresist' is a positive type of photoresist. Since the 'ED-resist' is a positive type of photoresist, it is difficult to get the 'ED-Resist' out of a plated through hole (it would be easy to get the 'ED-Resist' out of the plated through hole if the 'ED-resist' were a negative type of photoresist). However, since the positive 'ED-resist' layer reacts oppositely to the negative Dry-Film resist layer, it is necessary to get exposed light inside a plated through hole, which is not an easy task. A first possible solution to this problem includes adding a separate expose step to the 'ED-resist' layer only, where we try to image light into the non plated tooling holes using a specially selected expose tool that has a non-collimated light source (i.e., light from this expose tool is emitted in all directions). As a result, enough light could be emitted from the non-collimated light source inside the nonplated tooling holes to expose out the positive resist in the nonplated tooling holes and then subsequently develop-out that positive resist and then etch out the nonplated tooling holes. However, potential problems may exist in clearing out the nonplated tooling holes. If a first attempt to clear out the nonplated tooling hole using the non-collimated light source is not successful, a different type of expose tool may produce successful results in clearing out the nonplated tooling hole. A second possible solution to this problem includes conducting an entirely separate photolithography process prior to implementing the 'Application of Electro-Deposited (ED) Photoresist (ED Resist)' step, block 18 of FIG. 2. That is, prior to applying the 'ED resist' as outlined in block 18 of FIG. 2, implement the following separate photolithography process: (1) apply the Dry Film photoresist coating, (2) expose the tooling holes, and (3) implement the following three steps: (3a) develop, (3b) etch tooling holes, and (3c) strip resist. At this point, start the hybrid photolithography process in accordance with the present invention as illustrated in FIG. 2 by applying the 'ED resist' coating described above with reference to block 18 of FIG. 2. However, every time the PCB product undergoes the expose, develop, and etch steps, there is a potential for causing defects and, as a result, this additional photolithography pass could somewhat reduce (but not completely eliminate) the benefits of the hybrid photolithography process in accordance with the present invention shown in FIG. 2. A third possible solution to this problem includes adding a separate drilling step where the nonplated tooling holes are drilled after the PCB product has already been plated. Therefore, any holes that were drilled after plating will not have any copper inside the holes. Some PCB products, however, will require such a tight tolerance, for tooling hole locations versus other drilled hole locations, that a separate drilling step is not permissible.

In this specification, the term 'plated' through holes has been used. Do the holes need to be plated or can the holes be merely 'conductive'? The only reliable manufacturable method of making interconnections from the external surfaces of a printed circuit board to internal circuitry is to first drill vias through the board and then to make an electrical connection between the exposed innerlayer pad and the desired external pad. Therefore, although the term 'plated' has been used in connection with the through holes in a printed circuit board, for purposes of this invention, there must be an 'electrical connection' between the exposed innerlayer pad and the desired external pad; however, that 'electrical connection' must have some inherent weakness to the processes used to pattern the external surfaces.

In addition, although the above specification refers to 'through' holes, said holes can theoretically be of any depth; that is, either through the entire board or partially into the board (more commonly called a 'blind via'). In addition, any aperature will also be applicable.

In addition, although the above specification refers to 'dry' film resist, for purposes of this invention, a 'film resist' can also be used in lieu of a 'dry film resist'.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A photolithography process for printed circuit board patterning, the printed circuit board being copper plated and including a set of copper plated outer layers and one or more copper plated through holes, comprising the steps of:

electro-depositing a layer of photoresist onto the copper plated printed circuit board including the set of outer layers and the one or more plated through holes;

exposing a circuit image onto the electro-deposited photoresist layer;

developing and patterning the circuit image on the exposed electro-deposited photoresist layer;

applying a layer of dry film resist on top of the developed electro-deposited photoresist layer disposed on the printed circuit board; and exposing said circuit image onto the dry film resist layer; and developing and patterning said circuit image on the exposed dry film resist layer.

2. The process of claim 1, further comprising:

etching away any unwanted copper; and removing the electro-deposited photoresist layer and the dry film resist layer.

3. The process of claim 1, wherein the plated through holes each include an internal barrel, and wherein the electro-deposited photoresist layer is disposed inside the internal barrel of the plated through holes.

4. The process of claim 3, wherein the dry film resist layer is not disposed inside the internal barrel of the plated through holes.

5. The process of claim 4, wherein the electro-deposited photoresist layer is disposed over the set of outer layers of the printed circuit board.

6. The process of claim 5, wherein the dry film resist layer is disposed over the electro-deposited photoresist layer that is disposed over the set of outer layers of the printed circuit board.

7. The process of claim 1, wherein the plated through holes each include an internal barrel, and wherein the electro-deposited photoresist layer is disposed both inside the internal barrels of the plated through holes and over the set of copper plated outer layers of the printed circuit board.

8. The process of claim 7, wherein the dry film resist layer is disposed over only that portion of the electro-deposited photoresist layer that is disposed over the set of copper plated outer layers of the printed circuit board.

9. A method of patterning a printed circuit board, said board including copper plated external layers further including other circuitization features and one or more through holes each further including a copper plated internal barrel, comprising the steps of:

(a) applying an electro-deposited photoresist layer to at least a portion of said external layers and to said internal barrel of said one or more through holes;

(b) exposing an image on said electro-deposited photoresist layer;

(c) developing out said electro-deposited photoresist layer;

(d) applying a dry film resist layer to that portion of said electro-deposited photoresist layer which is disposed over said at least a portion of said external layers;

(e) exposing said image on said dry film resist layer; and (f) developing out said dry film resist layer.

10. The method of claim 9, further comprising:

(g) etching away any unwanted copper; and (h) removing both said electro-deposisted photoresist layer and said dry film resist layer.

11. The method of claim 9, wherein the exposing step (b) includes exposing an image on said electro-deposited photoresist layer with a first etch factor.

12. The method of claim 11, wherein the exposing step (e) includes exposing said image on said dry film resist layer with a second and different etch factor.

13. The method of claim 12, wherein said electro-deposited photoresist layer is disposed over both said at least a portion of said external layers and the internal barrels of said one or more through holes, said dry film resist layer being applied to that portion of said electro-deposited photoresist layer which is disposed over said at least a portion of said external layers, said dry film resist layer not being applied to the internal barrels of said one or more through holes.

14. A method of manufacturing a printed circuit board, comprising the steps of:

applying an electro-deposited photoresist layer to a copper-clad panel of the printed circuit board;

exposing an image onto the electro-deposited photoresist layer;

developing the exposed electro-deposited photoresist layer;

applying a film resist layer onto the developed electro-deposited photoresist layer;

exposing said image onto the film resist layer; and developing the exposed film resist layer.

15. The method of claim 14, further comprising:

etching away any unwanted copper; and removing the electro-deposited photoresist layer and the film resist layer.

16. The method of claim 14, wherein the image exposed onto the electro-deposited photoresist layer has a first etch factor.

17. The method of claim 16, wherein said image exposed onto the film resist layer has a second and different etch factor.

18. The method of claim 17, wherein the printed circuit board includes external surfaces and holes having internal barrels, and wherein said electro-deposited photoresist layer is coated over said external surfaces and inside said internal barrels of said holes, and wherein said film resist layer is coated over said external surfaces but is not coated inside said internal barrels of said holes.

19. The method of claim 18, wherein said film resist layer is a dry film resist layer.

20. The method of claim 19, wherein said holes are selected from a group consisting of: holes through the entire printed circuit board, holes partially into said printed circuit board, plated through holes, and apertures.

* * * * *